United States Patent
Wu et al.

(10) Patent No.: US 9,537,004 B2
(45) Date of Patent: Jan. 3, 2017

(54) SOURCE/DRAIN FORMATION AND STRUCTURE

(75) Inventors: Chii-Ming Wu, Taipei (TW);
Chien-Chang Su, Kaohsiung (TW);
Hsien-Hsin Lin, Hsin-Chu (TW);
Yi-Fang Pai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 144 days.

(21) Appl. No.: 13/114,910

(22) Filed: May 24, 2011

(65) Prior Publication Data

US 2012/0299121 A1 Nov. 29, 2012

(51) Int. Cl.
*H01L 29/78* (2006.01)
*H01L 21/336* (2006.01)
*H01L 21/225* (2006.01)
*H01L 29/66* (2006.01)

(52) U.S. Cl.
CPC ....... *H01L 29/7834* (2013.01); *H01L 21/2257* (2013.01); *H01L 29/6659* (2013.01); *H01L 29/66628* (2013.01); *H01L 29/66636* (2013.01)

(58) Field of Classification Search
CPC ............. H01L 29/7834; H01L 21/2257; H01L 29/6659; H01L 29/66628; H01L 29/66636; H01L 21/02532; H01L 21/02576
See application file for complete search history.

(56) References Cited

U.S. PATENT DOCUMENTS

| | | | | |
|---|---|---|---|---|
| 5,407,847 A | * | 4/1995 | Hayden et al. | 438/305 |
| 5,877,072 A | * | 3/1999 | Andideh et al. | 438/563 |
| 6,071,762 A | * | 6/2000 | Wu et al. | 438/151 |
| 6,137,149 A | | 10/2000 | Kodama | |
| 6,238,989 B1 | | 5/2001 | Huang et al. | |
| 7,030,012 B2 | | 4/2006 | Divakaruni et al. | |
| 7,157,374 B1 | * | 1/2007 | Waite et al. | 438/689 |
| 7,928,427 B1 | | 4/2011 | Chang | |
| 8,053,273 B2 | | 11/2011 | Kammler et al. | |
| 8,053,344 B1 | * | 11/2011 | Fung et al. | 438/561 |
| 8,211,784 B2 | * | 7/2012 | Hong et al. | 438/527 |
| 8,357,579 B2 | * | 1/2013 | Wong et al. | 438/290 |
| 2001/0023108 A1 | | 9/2001 | Miyano et al. | |
| 2002/0139996 A1 | * | 10/2002 | Jagannathan | H01L 29/66242 257/197 |
| 2005/0077570 A1 | | 4/2005 | Nishinohara | |
| 2005/0095799 A1 | | 5/2005 | Wang et al. | |
| 2005/0151203 A1 | | 7/2005 | Cho et al. | |

(Continued)

OTHER PUBLICATIONS

Bauer, M., "High throughput SEG of highly in-situ doped SiCP/SiP layers for NMOS devices using a Si3H8/SiH3CH3/PH3/Cl2 based CDE process," 2012, pp. 499-506, vol. 50, Issue 9, The Electrochemical Society, Prime 2012.

(Continued)

*Primary Examiner* — Savitr Mulpuri
(74) *Attorney, Agent, or Firm* — Slater Matsil, LLP

(57) ABSTRACT

A system and method for forming semiconductor structures is disclosed. An embodiment comprises forming a high diffusibility layer adjacent to a gate stack and forming a low diffusibility layer adjacent to the high diffusibility layer. After these two layers are formed, an anneal is performed to diffuse dopants from the high diffusibility layer underneath the gate stack to help form a channel region.

18 Claims, 9 Drawing Sheets

(56) References Cited

U.S. PATENT DOCUMENTS

| | | | |
|---|---|---|---|
| 2005/0184311 A1* | 8/2005 | Murthy et al. | 257/197 |
| 2006/0084235 A1 | 4/2006 | Barr et al. | |
| 2006/0088968 A1 | 4/2006 | Shin et al. | |
| 2006/0115933 A1 | 6/2006 | Ye et al. | |
| 2006/0228842 A1 | 10/2006 | Zhang et al. | |
| 2006/0234504 A1 | 10/2006 | Bauer et al. | |
| 2006/0289902 A1 | 12/2006 | Ping et al. | |
| 2007/0093033 A1 | 4/2007 | Wang et al. | |
| 2007/0235802 A1 | 10/2007 | Chong et al. | |
| 2007/0259501 A1 | 11/2007 | Xiong et al. | |
| 2007/0287272 A1 | 12/2007 | Bauer et al. | |
| 2008/0023752 A1* | 1/2008 | Chen et al. | 257/327 |
| 2009/0075029 A1 | 3/2009 | Thomas et al. | |
| 2009/0267118 A1 | 10/2009 | Chakravarti et al. | |
| 2010/0025779 A1 | 2/2010 | Kammler et al. | |
| 2010/0148270 A1 | 6/2010 | Golonzka et al. | |
| 2010/0301350 A1* | 12/2010 | Tamura et al. | 257/77 |
| 2011/0027956 A1 | 2/2011 | Domenicucci et al. | |
| 2011/0068403 A1 | 3/2011 | Hattendorf et al. | |
| 2011/0095343 A1* | 4/2011 | Chan et al. | 257/288 |
| 2011/0117732 A1 | 5/2011 | Bauer et al. | |
| 2011/0124169 A1 | 5/2011 | Ye et al. | |
| 2011/0212584 A9 | 9/2011 | Chakravarthi et al. | |
| 2011/0223736 A1 | 9/2011 | Lin et al. | |
| 2011/0266617 A1 | 11/2011 | Nakazawa et al. | |
| 2011/0269287 A1 | 11/2011 | Tsai et al. | |
| 2011/0303989 A1* | 12/2011 | Chuang et al. | 257/380 |
| 2011/0316044 A1* | 12/2011 | Chan et al. | 257/190 |
| 2012/0001228 A1* | 1/2012 | Chong et al. | 257/190 |
| 2012/0056245 A1 | 3/2012 | Kang et al. | |
| 2012/0070954 A1 | 3/2012 | Fung et al. | |
| 2012/0104498 A1 | 5/2012 | Majumdar et al. | |
| 2012/0295421 A1 | 11/2012 | Brabant et al. | |
| 2013/0056795 A1 | 3/2013 | Wu et al. | |
| 2013/0157431 A1 | 6/2013 | Tsai et al. | |
| 2013/0307076 A1 | 11/2013 | Cheng et al. | |
| 2013/0328126 A1 | 12/2013 | Tsai et al. | |
| 2014/0170840 A1 | 6/2014 | Tsai et al. | |
| 2014/0264575 A1 | 9/2014 | Tsai et al. | |

OTHER PUBLICATIONS

Fischer, P. R. et al., "Low Temperature Silcore Deposition of Undoped and Doped Silicon Films," 2006, pp. 203-215, vol. 3, Issue 2, ECS Transactions.

Lim, Kwan-Yong et al., "Novel-Stress Memorization-Technology (SMT) for High Electron Mobility Enhancement of Gate Last High-k/Metal Gate Devices", IEEE 2010, pp. 10.1.1-10.1.4.

* cited by examiner

SOURCE/DRAIN FORMATION AND STRUCTURE

BACKGROUND

Generally, when a source/drain region of a complementary metal oxide semiconductor (CMOS) transistor is formed through an epitaxial process, a single layer of a material (usually including a dopant) is formed. Such a layer may be a single layer of silicon with a dopant such as phosphorous. One method of forming this single layer uses a selective deposition process that utilizes a precursor such as dichlorosilane (DCS) along with an etchant such as hydrochloric acid in order to selectively grow a layer of epitaxial silicon on a base of underlying silicon material. This type of formation process forms a low activation, high diffusibility layer, in which the dopants can easily diffuse out of the epitaxial layer with a low temperature of anneal. However, by forming such a low activation, high diffusibility single layer, diffusion from such a layer cannot be well controlled, leading to concerns regarding short channel effects in devices formed from such a process.

In order to address these concerns, another process has been attempted by which a high activation and low diffusibility single layer has been formed. In such a process a precursor such as $Si_2H_6$ or $Si_3H_8$ is utilized to form both a layer of epitaxial silicon over an underlying silicon layer along with a layer of polysilicon over non-silicon layers. After such a growth and deposition, the unit may be purged of precursors and a selective etching of the polysilicon (using etchants such as HCl along with a catalyst like of $GeH_4$) may be initiated in order to remove, the polysilicon without removing the epitaxially grown silicon (or partially removing the epitaxially grown silicon). This deposition and selective etching may be repeated a number of times in a cyclical fashion in order to grow the desired epitaxial silicon layer to the desired thickness.

However, this cyclical process also has its drawbacks. In particular, this process forms a high activation and low diffusibility single layer that leads to an increase of the resistance within the LDD region of transistors. Additionally, the use of this cyclical process can lead to the formation of voids underneath spacers that may be used with the gate stack. As such, this cyclical process forms a high activation, low diffusibility single layer that has its own problems to replace the problems with which it helps.

SUMMARY OF THE INVENTION

These and other problems are generally solved or circumvented, and technical advantages are generally achieved, by preferred embodiments of the present invention that allow for the formation of semiconductor devices.

In accordance with an embodiment, a method for manufacturing a semiconductor device comprising forming a gate stack over a channel region of a substrate and forming a first layer adjacent to the channel region is provided. A second layer is formed adjacent to the first layer, wherein the first layer has a higher diffusibility than the second layer, and an annealing process is performed, wherein the annealing process diffuses a first material from the first layer into the channel region.

In accordance with another embodiment, a method of manufacturing a semiconductor device comprising forming a gate stack over a substrate and forming a recess in the substrate adjacent to the gate stack is provided. A first layer is formed within the recess, the first layer having a first diffusibility. A second layer is formed within the recess, wherein the second layer has a second diffusibility lower than the first diffusibility and wherein the first layer and the second layer jointly fill the recess. The first layer is annealed such that dopants within the first layer diffuse into the substrate beneath the gate stack.

In accordance with another embodiment, a semiconductor device comprising a gate stack overlying a channel region in a substrate is provided. A recess is in the substrate adjacent to the gate stack and a first layer is located within the recess adjacent to a portion of the substrate located beneath the gate stack. Dopants are located within the first layer and extending into the substrate beneath the gate stack, the dopants having a concentration profile that reduces as the dopants extend into the channel region from the first layer. A second layer is located within the recess adjacent to the first layer, the second layer having a lower diffusibility than the first layer.

BRIEF DESCRIPTION OF THE DRAWINGS

For a more complete understanding of embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the disclosed embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments.

The embodiments will be described with respect to specific embodiments in a specific context, namely a source/drain region for a complementary metal-oxide semiconductor (CMOS) transistor. The embodiments may also be applied, however, to other doped regions within a semiconductor device.

Figure 1:
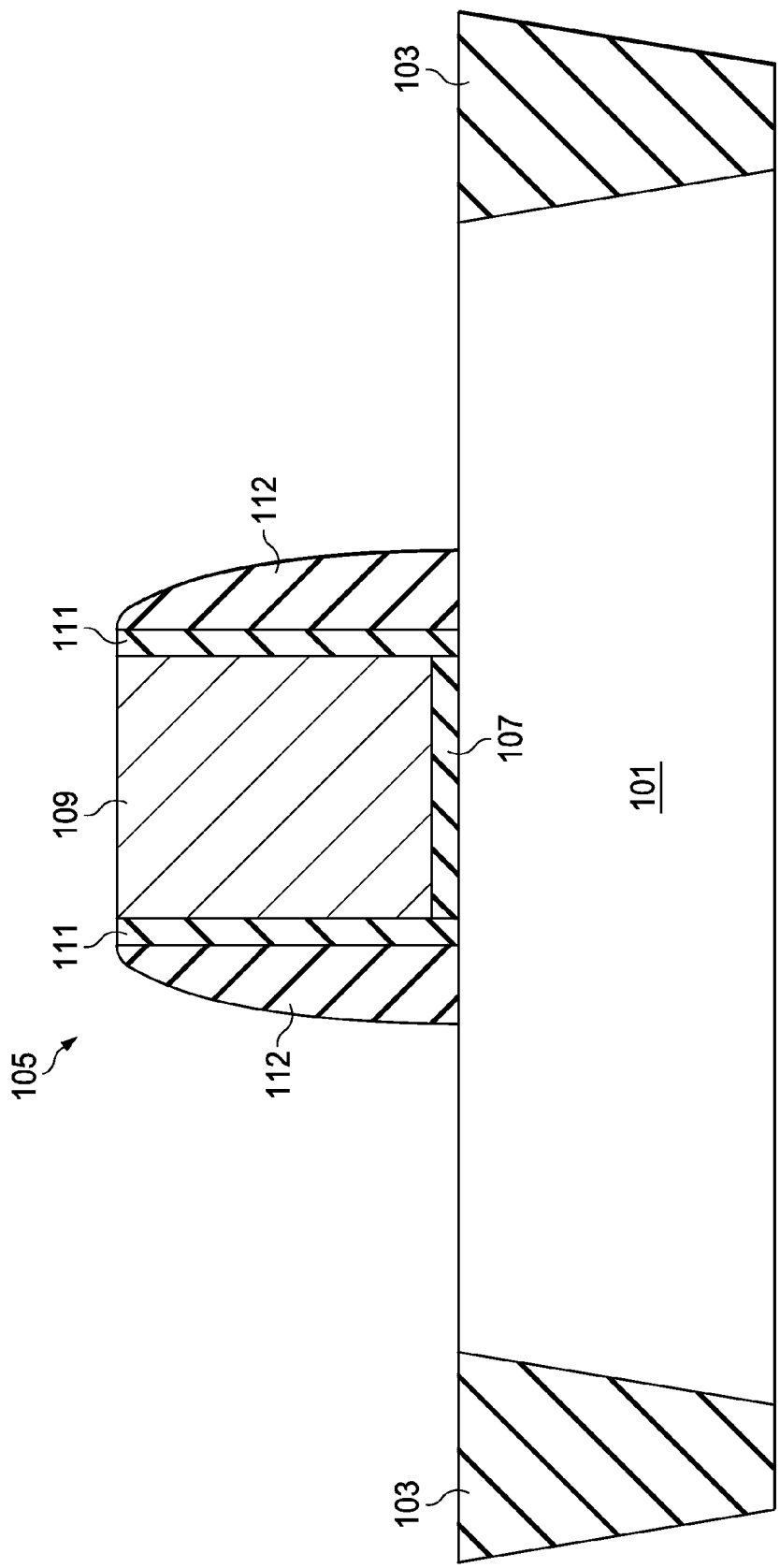
FIG. 1 illustrates a substrate with a shallow trench isolation in accordance with an embodiment.

With reference now to FIG. 1, there is shown a substrate 101 with shallow trench isolations (STIs) 103 formed therein. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The STIs 103 may be formed by etching the substrate 101 to form a trench and filling the trench with a dielectric material as is known in the art. For example, the STIs 103 may be filled with a dielectric material such as an oxide material, a high-density plasma (HDP) oxide, or the like, formed by methods known in the art.

A gate stack 105 comprising a gate dielectric 107, a gate electrode 109, first spacers 111, and second spacers 112 may be formed over the substrate 101. The gate dielectric 107 may be a dielectric material, such as silicon oxide, silicon oxynitride, silicon nitride, an oxide, a nitrogen-containing oxide, a combination thereof, or the like. The gate dielectric 107 may have a relative permittivity value greater than about 4. Other examples of such materials include aluminum oxide, lanthanum oxide, hafnium oxide, zirconium oxide, hafnium oxynitride, or combinations thereof.

In an embodiment in which the gate dielectric 107 comprises an oxide layer, the gate dielectric 107 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In an embodiment, the gate dielectric 107 may be between about 8 Å to about 200 Å in thickness.

The gate electrode 109 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like. In an embodiment in which the gate electrode 109 is poly-silicon, the gate electrode 109 may be formed by depositing doped or undoped poly-silicon by low-pressure chemical vapor deposition (LPCVD) to a thickness in the range of about 400 Å to about 2,400 Å, such as about 1,400 Å.

Once the gate dielectric 107 and the gate electrode 109 have been formed, the gate dielectric 107 and gate electrode 109 may be patterned. In an embodiment, the gate dielectric 107 and the gate electrode 109 may be patterned using, e.g., a photolithographic masking and etching process, whereby a photolithographic mask (not shown in FIG. 1) is formed over the gate electrode 109 and then exposed to a patterned light. After exposure, desired portions of the photolithographic mask are removed to exposed the underlying gate electrode 109, which may then be etched to remove the exposed portions, thereby patterning the gate electrode 109 and the gate dielectric 107.

The first spacers 111 and the second spacers 112 may be formed by blanket depositing one or more spacer layers (not shown) over the gate electrode 109 and the substrate 101. The spacer layers may comprise SiN, oxynitride, SiC, SiON, oxide, and the like and may be formed by commonly used methods such as chemical vapor deposition (CVD), plasma enhanced CVD, sputter, and other methods known in the art. The spacer layers may be patterned, such as by isotropically or anisotropically etching, thereby removing the spacer layers from the horizontal surfaces of the structure and forming the first spacers 111 and the second spacers 112 as illustrated in FIG. 1.

However, as one of ordinary skill in the art will recognize, the process described above and the resulting shape of the first spacers 111 and the second spacers 112 as illustrated in FIG. 1 are intended to be merely illustrative and are not intended to limit the embodiments to these descriptions. Rather, any suitable number and combination of spacers layers and shapes may be utilized in order to form spacers for the gate stack 105, and any suitable combination of spacers may alternatively be utilized.

Figure 2:
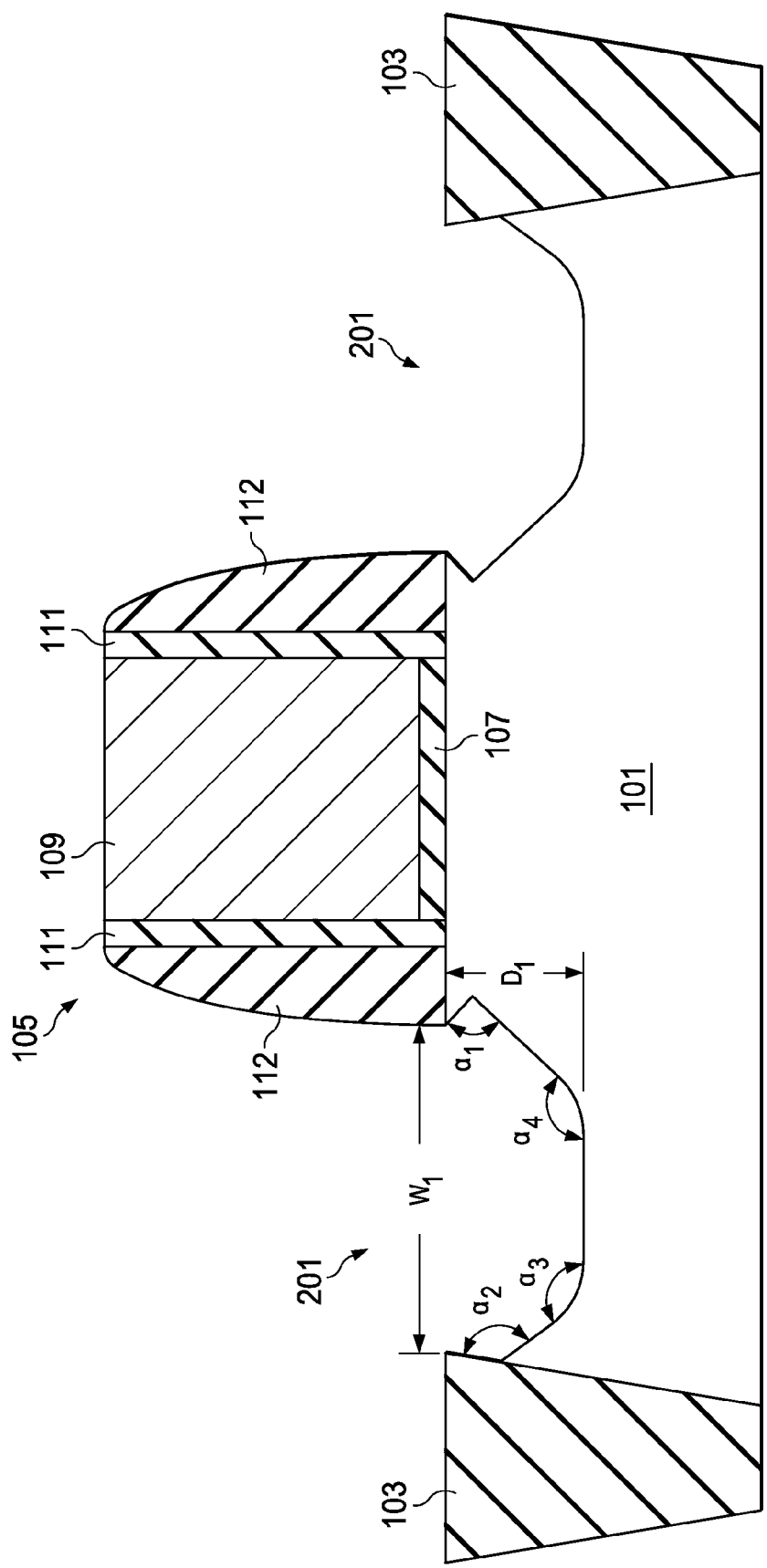
FIG. 2 illustrates a recess formed within the substrate in accordance with an embodiment.

FIG. 2 illustrates the formation of recesses 201 within the substrate 101. The recesses 201 may be formed using, e.g., a wet etch process selective to the material of the substrate 101 and uses the gate stack 105, the first spacers 111, and the second spacers 112 as a hard mask in order to form the recesses 201. An etchant such as carbon tetrafluoride ($CF_4$) or tetramethylammonium hydroxide (THMA), combinations of these, or the like may be used to perform the wet etch and form the recesses 201. By using the STIs 103, the gate stack 105, the first spacers 111, and the second spacers 112 as hard masks, the recesses 201 provide an opening in the substrate 101 into which source/drain regions (whose formation is described further below with respect to FIGS. 3-5) will subsequently be formed.

The recesses 201 may be formed to have a width $W_1$ of between about 20 Å and about 100 Å, such as about 50 Å, and may additionally undercut the first spacers 111 and/or the second spacers 112. Additionally, the wet etch process may be continued until the recesses 201 have a depth $D_1$ from a surface of the substrate 101 of between about 50 Å and about 800 Å, such as about 500 Å. However, these dimensions are not intended to limit the present embodiments, as any suitable dimensions for the recesses 201 may alternatively be utilized.

The recesses 201 may be formed to have either an angular or rounded shape. In an embodiment in which the recesses 201 have an angular shape, the recesses 301 may be formed to have a first angle $\alpha_1$ and a second angle $\alpha_2$ along with top of the recesses 201 and a third angle $\alpha_3$ and a fourth angle $\alpha_4$ along the bottom of the recesses 201. In this embodiment, the first angle $\alpha_1$ and the second angle $\alpha_2$ may be formed to have an angle of between about 90° and about 180°, such as about 110°. Additionally, the first angle $\alpha_1$ and the second angle $\alpha_2$ may have either the same or different angles from each other. The third angle $\alpha_3$ and the fourth angle $\alpha_4$ may be formed to have an angle of between about 85° and about 170°, such as about 125°.

Figure 3:
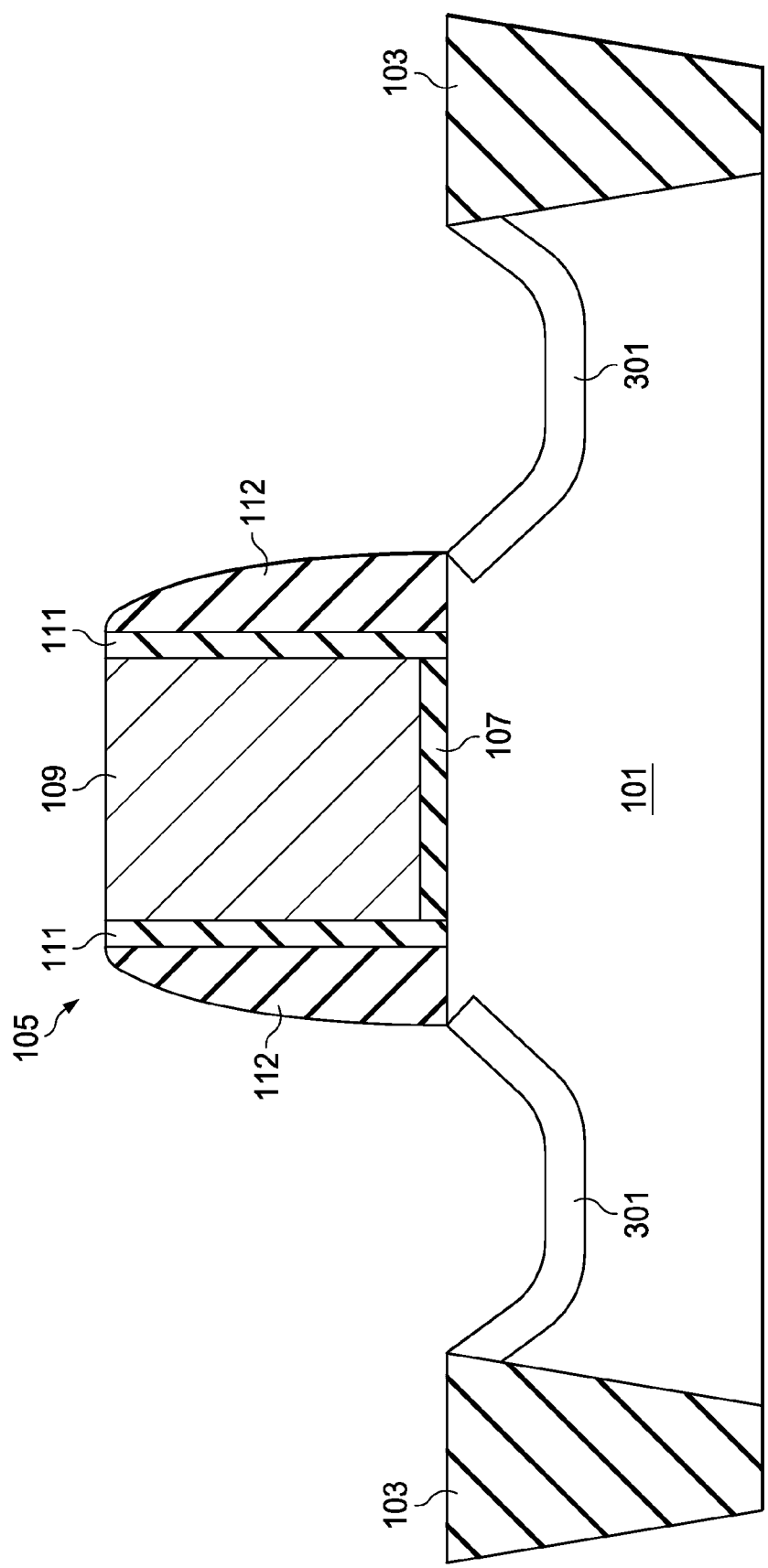
FIG. 3 illustrates a formation of a high diffusibility layer in accordance with an embodiment.

FIG. 3 illustrates the formation of a high diffusibility layer 301. In an embodiment, the high diffusibility layer 301 may comprise a semiconductor such as silicon along with a dopant, such as phosphorous, arsenic, carbon, combinations of these, or the like, that is relatively easier to diffuse into the substrate 101 that a low diffusibility layer 401 (not shown in FIG. 3 but illustrated and discussed below with respect to FIG. 4). In an embodiment the high diffusibility layer 301 may comprise silicon and phosphorous, with the phosphorous having a concentration of between about 0.1% and about 2%, such as about 1%. By forming the high diffusibility layer 301 with a dopant that is relatively easier to diffuse into the substrate 101, the high diffusibility layer 301 has a lower activation, by which a subsequent anneal can be used to drive a larger number of dopant atoms into the substrate 101 to form a lightly doped drain (LDD) (discussed further below with respect to FIG. 5).

In an embodiment, the relative ease of diffusion may be controlled through the placement of the dopants into the lattice. For example, the dopants (in the above described embodiment phosphorous) are formed such that the dopants are located in interstitial locations within the silicon lattice, and are not located only in substitutional locations. As such, because the dopants are not located in a substitutional site, the dopants more easily diffuse out of the high diffusibility layer 301 and into the surrounding substrate.

The high diffusibility layer 301 may be formed, e.g., using an epitaxial growth process with precursor gases such as silane ($SiH_4$), dichlorosilane ($Si_2H_2Cl_2$), so that the high diffusibility layer 301 may be formed conformally along the bottom and sidewalls of the recesses 201, with a thickness of between about 30 Å and about 500 Å, such as about 200 Å. By forming the high diffusibility layer 301 conformally, the high diffusibility layer 301 may fill the portion of the recesses 201 that undercut the first spacers 111 and the second spacers 112. Dopants such as phosphorous may be introduced using a precursor such as phosphine ($PH_3$) or tertiarybutylphosphine. A carrier gas flow rate of between about 10 standard liters per minute (slm) and about 45 slm, such as about 20 slm may be used to help introduce the precursors to the substrate 101. However, as one of ordinary skill in the art will recognize, other suitable precursors, such as arsenous trichloride or arsine ($AsH_3$), may alternatively be utilized, and these and all other suitable precursors may alternatively be utilized to form the high diffusibility layer 301.

Additionally, in order to obtain the interstitial locations for the dopants within the high diffusibility layer 301, the high diffusibility layer 301 may be formed at a high pressure and temperature. For example, the high diffusibility layer 301 may be formed at a pressure of between about 200 torr and about 1 atmospheres (atm), and at a temperature of between about 550° C. and about 750° C., such as about 700° C. This high pressure leads to the formation of dopants into interstitial sites within the silicon lattice.

Additionally, the precise processes described above in order to increase the relative diffusibility of the dopants in the high diffusibility layer 301 relative to the low diffusibility layer 401 are intended to be illustrative only and are not intended to be limiting to the embodiments described here. Any other process that may be used to increase the diffusibility of dopants within the high diffusibility layer 301 relative to the low diffusibility layer 401 may alternatively be utilized, and all suitable processes are fully intended to be included within the scope of the present embodiments.

Figure 4:
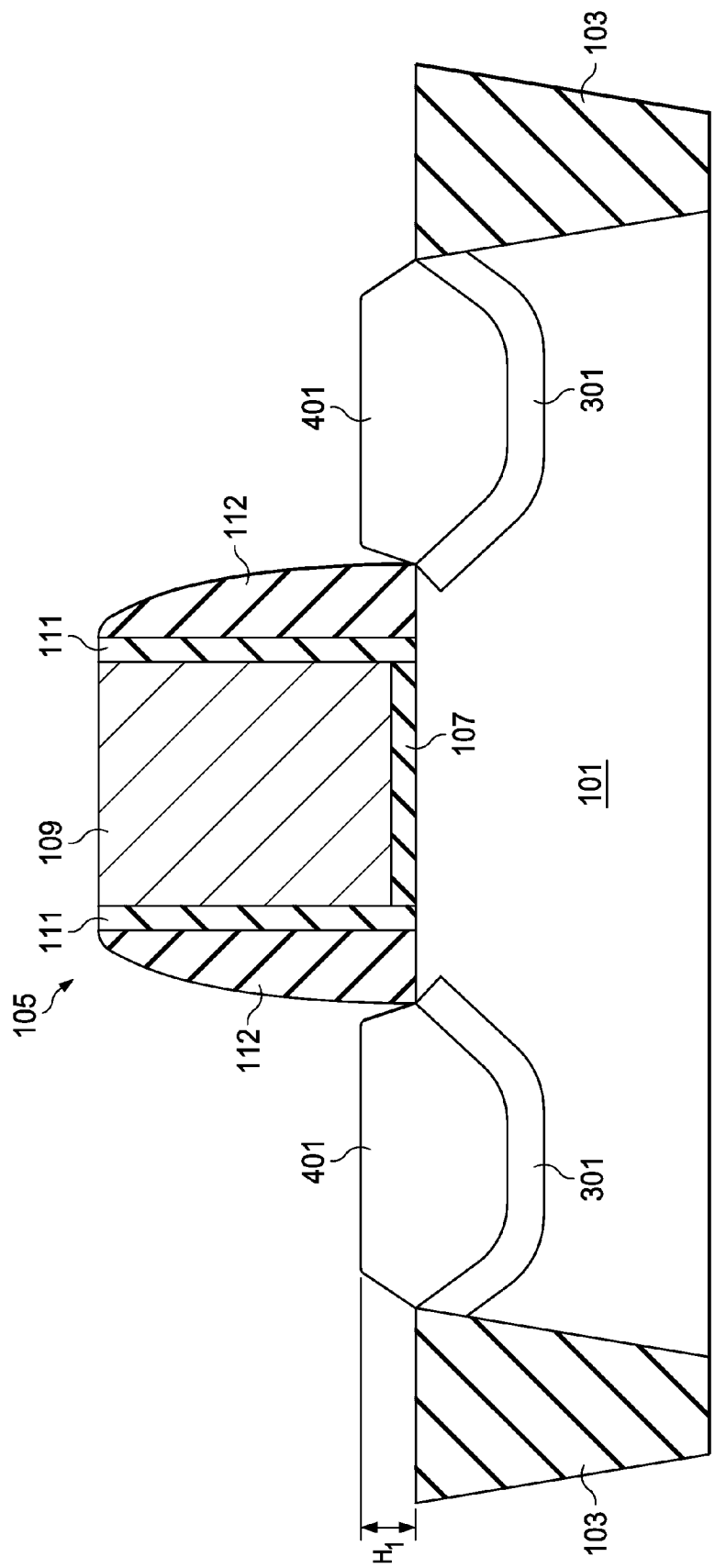
FIG. 4 illustrates a formation of a low diffusibility layer in accordance with an embodiment.

FIG. 4 illustrates that, after the high diffusibility layer 301 has been formed, a low diffusibility layer 401 may be formed over the high diffusibility layer 301. In an embodiment, the low diffusibility layer 401 may have a diffusibility that is less than the high diffusibility layer 301 and may be formed using a process such as chemical vapor deposition, and may comprise a similar atomic compound as the high diffusibility layer 301, such as silicon with dopants such as phosphorous, arsenic, and carbon. However, the concentration of these dopants may be increased compared to the high diffusibility layer 301, such as between about 0.1% and about 2%, such as about 1.5%.

The low diffusibility layer 401 may be formed using silicon precursors such as trisilane ($Si_3H_8$), disilane, combinations of these, or the like, along with a carrier gas flow rate of between about 10 slm and about 45 slm, such as about 20 slm. Additionally, dopants precursors such as phosphine ($PH_3$) or tertiarybutylphosphine may be introduced in order to dope the low diffusibility layer 401. The pressure for the formation of the low diffusibility layer 401 may be between about 5 torr and about 300 torr, such as about 120 torr and the process temperature may be between about 500° C. and about 650° C., such as about 600° C.

The formation of the low diffusibility layer 401 may continue until the recesses 201 (discussed above with respect to FIG. 2) are completely filled by both the high diffusibility layer 301 and the low diffusibility layer 401. Additionally, the formation of the low diffusibility layer 401 may continue so that the low diffusibility layer 401 is formed to rise above the substrate 101 to a first height $H_1$ of between about 20 Å and about 350 Å, such as about 200 Å.

Figure 5:
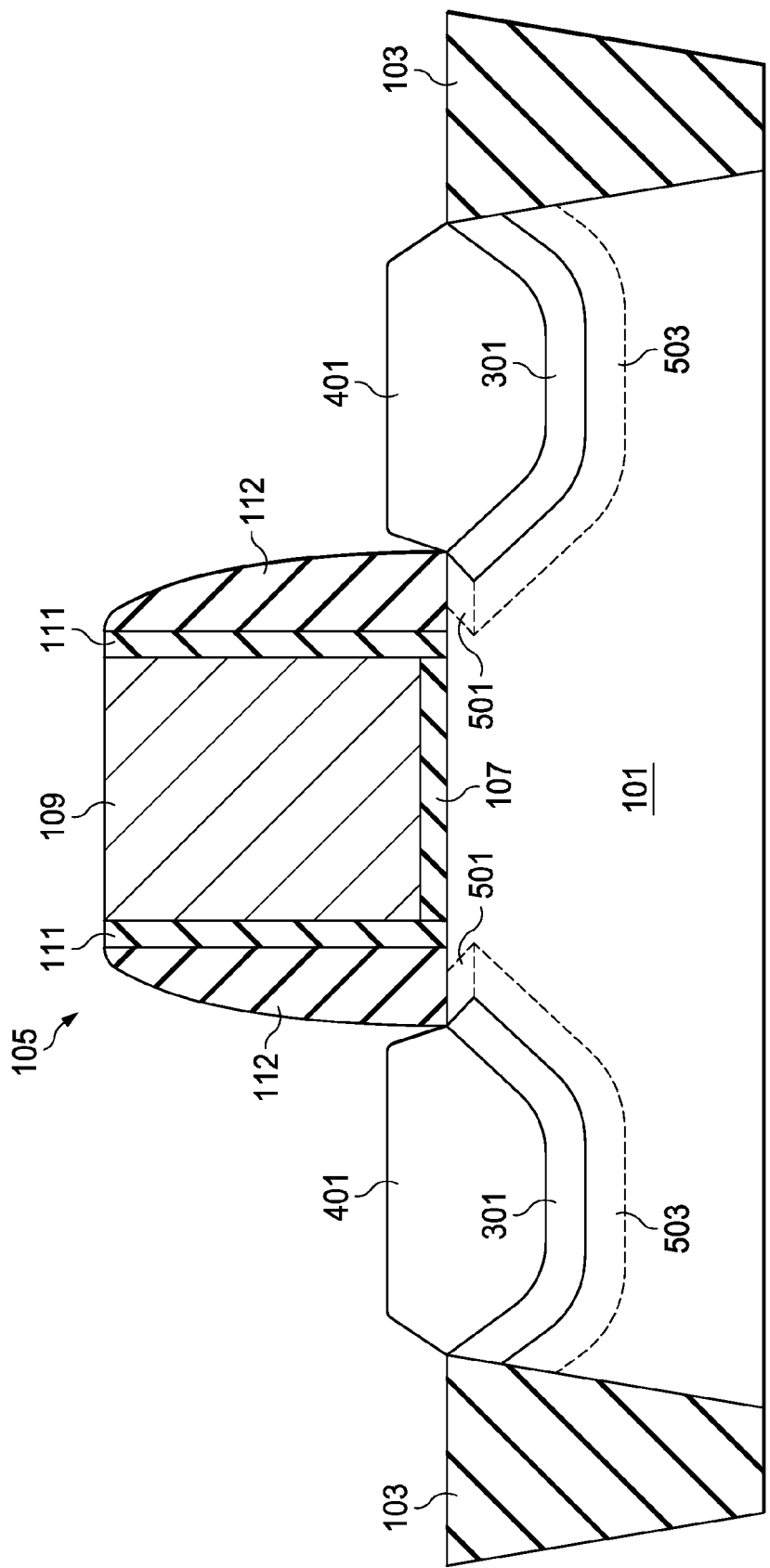
FIG. 5 illustrates the results of an anneal in accordance with an embodiment.

FIG. 5 illustrates that, after the low diffusibility layer 401 has been formed, an anneal may be performed in order to drive the dopants from the high diffusibility layer 301 to form an LDD region 501 (illustrated in FIG. 5 by the dotted lines adjacent to the second spacers 112) as well as driving the dopants into the substrate 101 to form a dopant region 503. Because of the diffusion of the dopants, the dopants will have a concentration profile that reduces the further away from the high diffusibility layer 301 the dopants diffuse. The anneal may be, e.g., a rapid thermal anneal which raises the temperature of the substrate 101 to between about 800° C. and about 1,300° C., such as about 1,000° C. for between about $1 \times 10^{-6}$ seconds to about 2 seconds, such as about 1 second. Alternatively, the anneal may be a sub-second anneal (SSA), a laser spike anneal (LSA), combinations of these, or the like, and any other suitable anneal may also may utilized to drive the dopants into the LDD region 501.

Figure 6A:
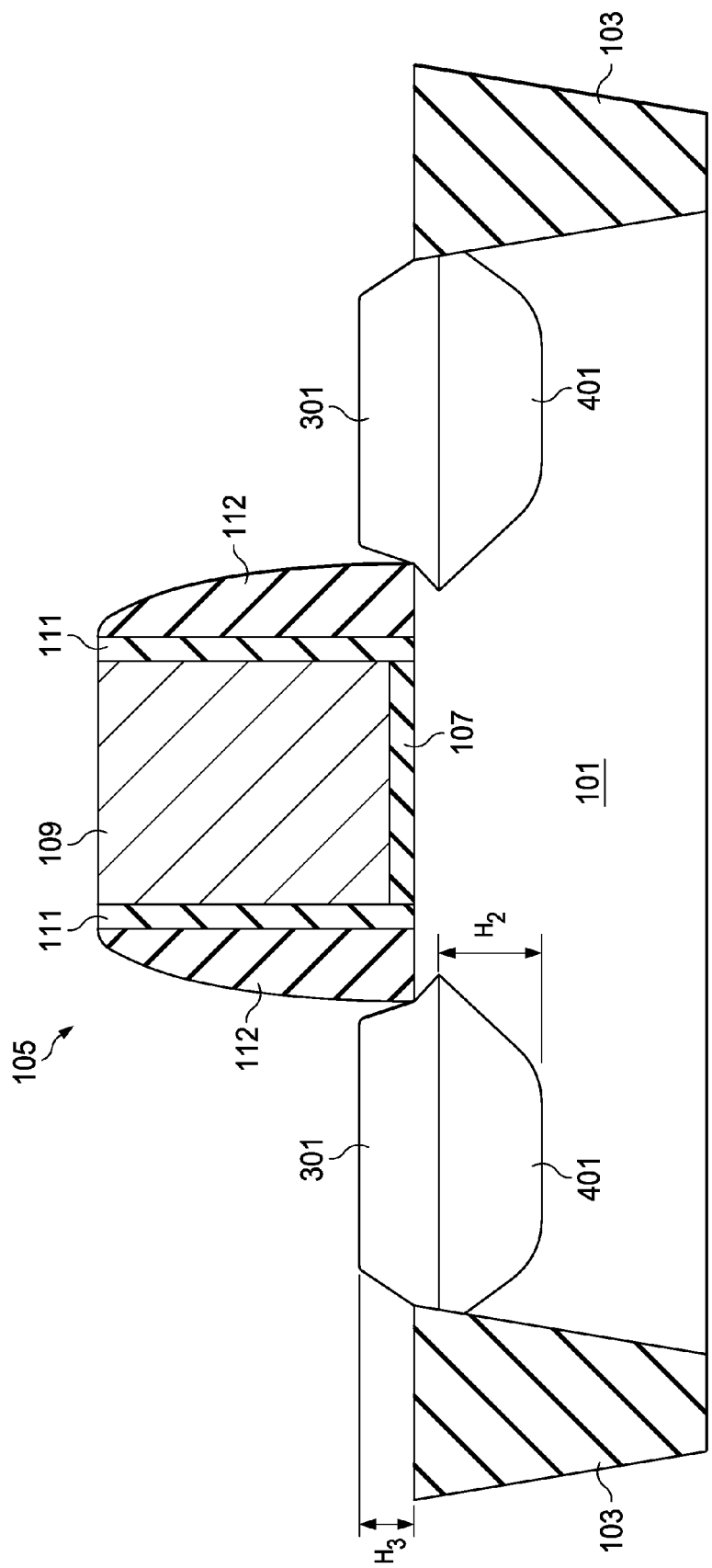
FIGS. 6A-6B illustrate another embodiment in which the low diffusibility layer is formed beneath the high diffusibility layer in accordance with an embodiment.

FIG. 6A illustrates another embodiment in which the low diffusibility layer 401 is formed along the bottom of the recesses 201 (shown in FIG. 6A as already being filled) before the high diffusibility layer 301. In this embodiment, after the recesses 201 have been formed, the low diffusibility layer 401 may be formed within the recesses 201 using a process similar to the process described above with respect to FIG. 4. The low diffusibility layer 401 may be formed to have a second height $H_2$ from the bottom of the recesses 201 of between about 10 Å and about 750 Å, such as about 400 Å, that remains below the surface of the substrate 101 by a height of between about 10 Å and about 250 Å, such as about 150 Å.

Once the low diffusibility layer 401 has been formed, the high diffusibility layer 301 may be formed to finish filling the recesses 201 and, if desired, extend above the substrate 101 to a third height $H_3$ above the substrate 101 of between about 20 Å and about 350 Å, such as about 200 Å. In this embodiment, the high diffusibility layer 301 may be formed through a process that is similar to the process described above with respect to FIG. 3.

Figure 6B:
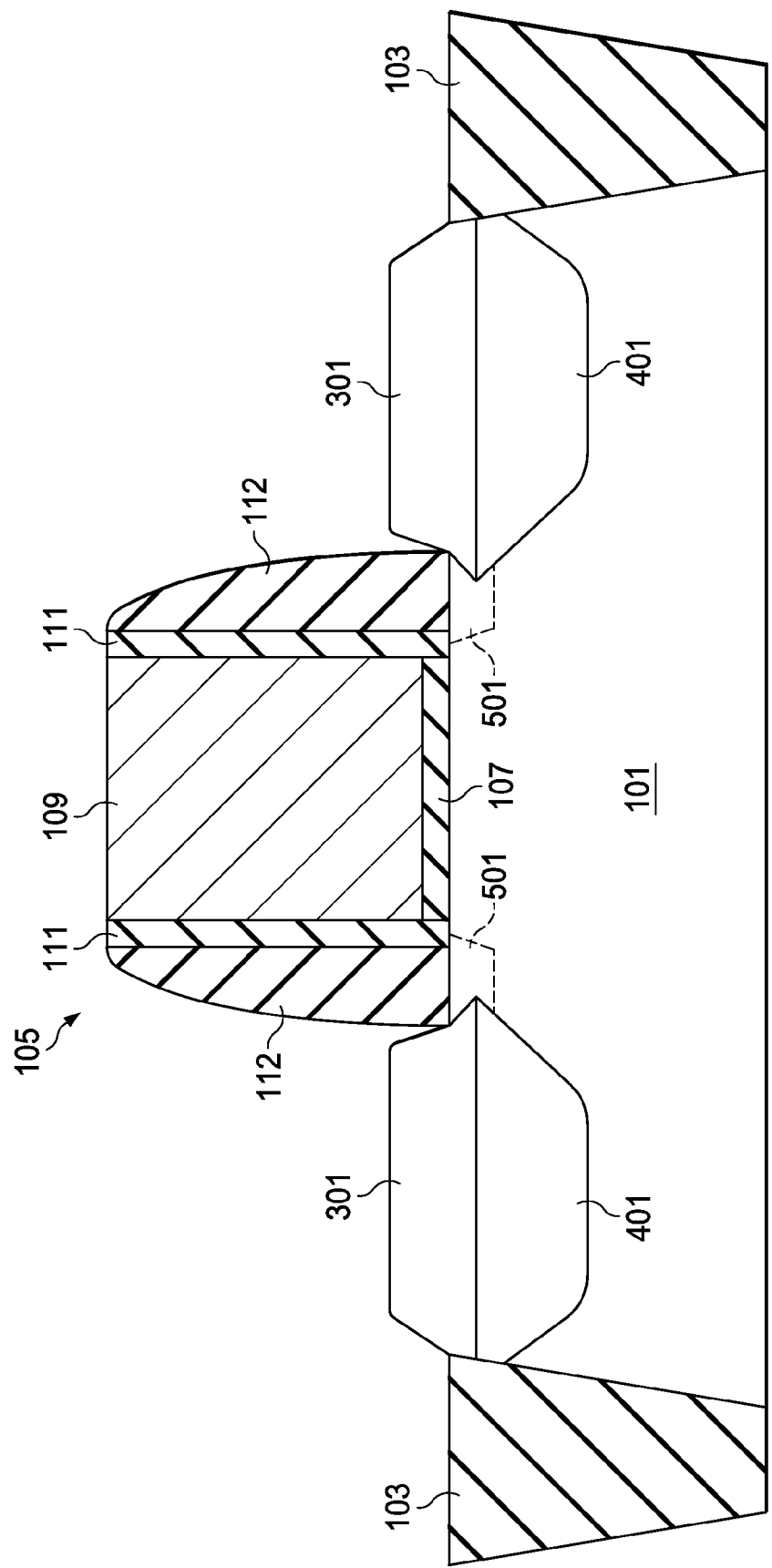

FIG. 6B illustrates that, once the high diffusibility layer 301 has been formed over the low diffusibility layer 401, the two layers may be annealed using an anneal similar to that described above with respect to FIG. 5. However, in this embodiment, the dopants within the high diffusibility layer 301 extend primarily to form the LDD region 501 (which may have a different shape than the LDD region 501 illustrated in FIG. 5) while the low diffusibility layer 401 blocks substantial diffusion of the dopants within the high diffusibility layer 301 from extending into other portions of the substrate 101. However, it should be understood that, while not shown in FIG. 6B, some minor diffusion from the low diffusibility layer 401 into the surrounding substrate 101 may occur during the anneal.

Figure 7A:
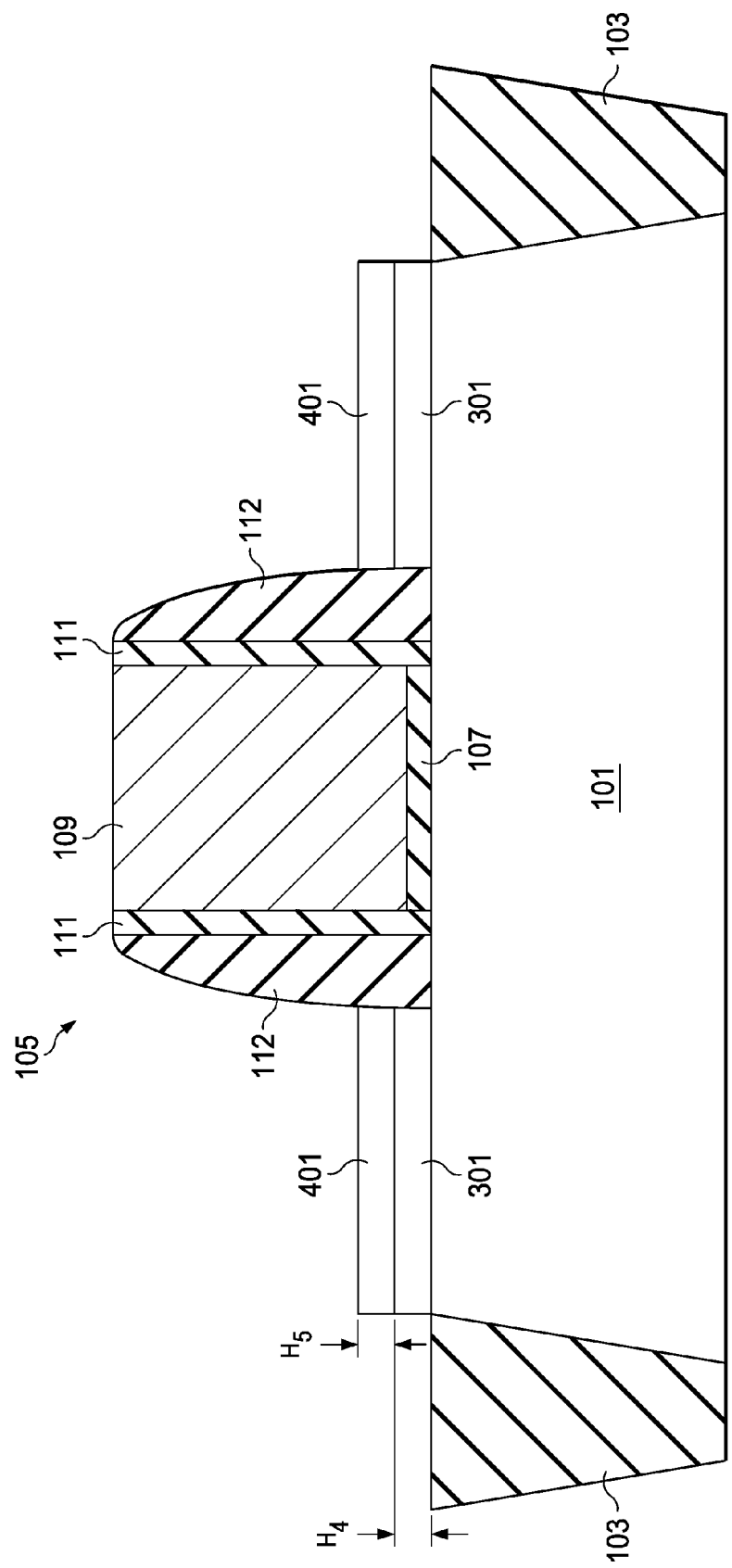
FIGS. 7A-7B illustrate yet another embodiment in which the high diffusibility layer and the low diffusibility layer are formed without a recess in the substrate in accordance with an embodiment.

FIG. 7A illustrates yet another embodiment in which the high diffusibility layer 301 may be formed on the substrate 101 without forming the recesses 201. In this embodiment the high diffusibility layer 301 may be formed using a process similar to the process described above with respect to FIG. 3, with the process continuing to form the high diffusibility layer 301 to a fourth height $H_4$ above the substrate 101 of between about 20 Å and about 150 Å, such as about 100 Å.

After the high diffusibility layer 301 is formed over the substrate 101, the low diffusibility layer 401 may be formed over the high diffusibility layer 301. The low diffusibility layer 401 may be formed using a process similar to the process described above with respect to FIG. 4, and may be formed to a fifth height $H_5$ of between about 20 Å and about 250 Å, such as about 200 Å.

Figure 7B:
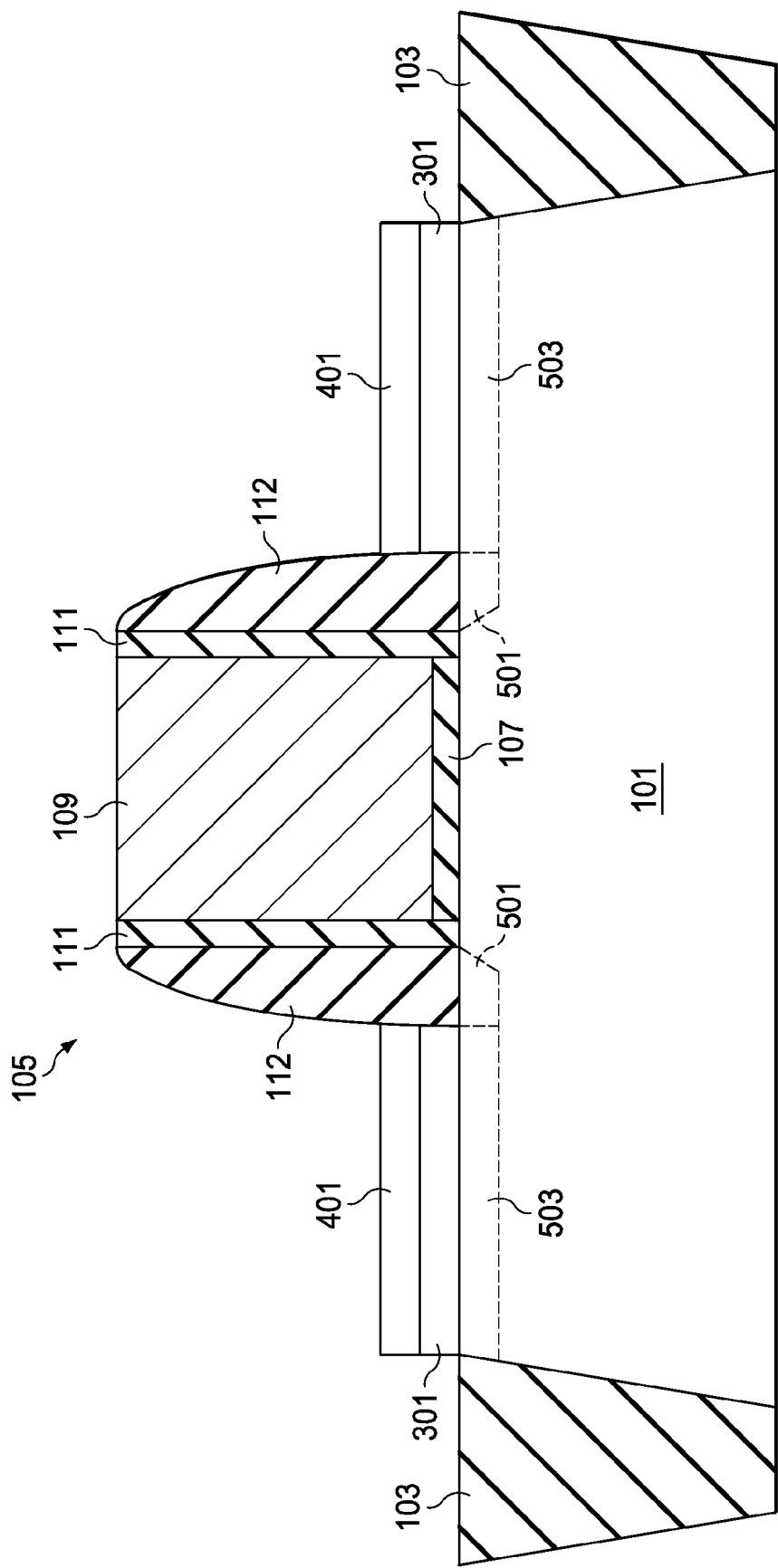

FIG. 7B illustrates that, once the high diffusibility layer 301 and the low diffusibility layer 401 have been formed, the two layers may be annealed using an anneal similar to that described above with respect to FIG. 5. In this embodiment, the dopants within the high diffusibility layer 301 diffuse into the substrate 101 and form the desired LDD region 501 along with the dopant region 503 (although it may have a different shape the LDD region 501 illustrated in FIGS. 5 and 6B).

By utilizing a high diffusibility layer 301 to form the LDD region 501, a dopant implantation step is not necessary, and the entire step may be removed, thereby limiting or removing damage done by an implant step. Additionally, by utilizing a low diffusibility layer 401 in conjunction with the high diffusibility layer 301, the overall resistance of the LDD region 501 may be reduced. Finally, by utilizing a selective epitaxial growth for the high diffusibility layer 301, voids that may be formed underneath the spacers may be avoided.

In accordance with an embodiment, a method for manufacturing a semiconductor device is provided, the method comprising forming a gate stack over a channel region of a substrate and forming a first layer adjacent to the channel region. A second layer is formed adjacent to the first layer, wherein the first layer has a higher diffusibility than the second layer. An annealing process is performed, wherein the annealing process diffuses a first material from the first layer in to the channel region.

In accordance with another embodiment, a method of manufacturing a semiconductor device is provided, the method comprising forming a gate stack over a substrate and forming a recess in the substrate adjacent to the gate stack. A first layer is formed within the recess, the first layer having a first diffusibility. A second layer is formed with the recess, wherein the second layer has a second diffusibility lower than the first diffusibility and wherein the first layer and the second layer jointly fill the recess. The first layer is annealed such that dopants within the first layer diffuse into the substrate beneath the gate stack.

In accordance with yet another embodiment, a semiconductor device comprising a gate stack overlying a channel region in a substrate and a recess in the substrate adjacent to the gate stack is provided. A first layer is located within the recess adjacent to a portion of the substrate located beneath the gate stack and dopants are located within the first layer and extending into the substrate beneath the gate stack. The dopants have a concentration profile that reduces as the dopants extend into the channel region from the first layer. A second layer is located within the recess adjacent to the first layer, the second layer having a lower diffusibility than the first layer.

Although the embodiments and their advantages have been described in detail, it should be understood that various changes, substitutions and alterations can be made herein without departing from the spirit and scope of the embodiments as defined by the appended claims. For example, different dopants may be utilized, and different methods of formation may also be utilized to form the high diffusivity layer and low diffusibility layer. As another example, it will be readily understood by those skilled in the art that certain process steps may be varied while remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method for manufacturing a semiconductor device, the method comprising:
    forming a gate stack over a channel region of a substrate;
    forming a first layer adjacent to the channel region;
    forming a second layer adjacent to the first layer, wherein the first layer has a higher diffusibility than the second layer and wherein the first layer has a lower concentration of a dopant than the second layer, wherein forming the first layer is performed at a higher pressure than the second layer, wherein the first layer is formed at least in part in an environment having a pressure between about 200 torr and about 1 atmospheres, and wherein the second layer is formed at least in part in an environment having a pressure between about 5 torr and about 300 torr, wherein the second layer comprises a second dopant that is different from the first dopant, wherein the first dopant has a first concentration within interstitial locations of the first layer and the second dopant has a second concentration within interstitial locations of the second layer less than the first concentration; and
    performing an annealing process, wherein the annealing process diffuses a first material from the first layer into the channel region.

2. The method of claim 1, further comprising forming a recess in the substrate adjacent to the channel region, wherein the forming the first layer forms the first layer along a bottom of the recess.

3. The method of claim 2, wherein the forming the second layer comprises forming the second layer over the first layer, the second layer filling the recess.

4. The method of claim 3, wherein the forming the second layer comprises forming the second layer such that the second layer extends above the substrate.

5. The method of claim 1, wherein the first layer and the second layer comprise the same atomic compound.

6. The method of claim 1, further comprising forming a recess in the substrate adjacent to the channel region, wherein the forming the second layer comprises forming the second layer along a bottom of the recess.

7. The method of claim 6, wherein the forming the first layer forms the first layer over the second layer and adjacent to the channel region.

8. The method of claim 1, wherein the forming the first layer is performed at least in part in an environment having a temperature between about 550° C. and about 750° C.

9. A method of manufacturing a semiconductor device, the method comprising:
    forming a gate stack over a substrate;
    removing a portion of the substrate to form a recess in the substrate adjacent to the gate stack, wherein the removing the portion of the substrate forms a sidewall;
    forming a first layer within the recess, the first layer having a first diffusibility, wherein the first layer comprises a first dopant, wherein the forming the first layer is performed at least in part at a pressure between about 200 torr and about 1 atmospheres, and wherein the first layer is in physical contact with the sidewall along the entire length of the recess;
    forming a second layer within the recess, wherein the second layer has a second diffusibility lower than the first diffusibility, wherein the forming the second layer is performed at least in part in an environment having a pressure between about 5 torr and about 300 torr, wherein the first layer is formed at a higher pressure than the second layer, wherein the second layer comprises a second dopant that is different from the first dopant, wherein the first dopant has a first concentration within interstitial locations of the first layer and the second dopant has a second concentration within interstitial locations of the second layer less than the first concentration, and wherein the first layer and the second layer jointly fill the recess; and
    annealing the first layer such that dopants within the first layer diffuse into the substrate beneath the gate stack.

10. The method of claim 9, wherein the forming the first layer is performed before the forming the second layer.

11. The method of claim 9, wherein the forming the second layer is performed before the forming the first layer.

12. The method of claim 9, wherein the forming the first layer further comprises forming a third layer, the third layer comprising silicon and phosphorous.

13. The method of claim 12, wherein the forming the second layer further comprises forming a fourth layer, the fourth layer comprising silicon and phosphorous.

14. A method of manufacturing a semiconductor device, the method comprising:
    depositing a gate stack over a substrate;
    removing a portion of the substrate to form a recess;
    depositing a first layer into the recess, the first layer comprising a first dopant with a first diffusibility into the substrate, wherein the depositing the first layer is performed at least in part at a pressure between about 200 torr and about 1 atmospheres;
    depositing a second layer into the recess, the second layer comprising a second dopant with a second diffusibility into the substrate, wherein the second diffusibility is less than the first diffusibility, wherein the first dopant has a first concentration within interstitial locations of the first layer and the second dopant has a second concentration within interstitial locations of the second layer less than the first concentration, and wherein the depositing the second layer is performed at least in part in an environment having a pressure between about 5 torr and about 300 torr; and
    annealing the first layer and the second layer to diffuse the first dopant into the substrate.

15. The method of claim 14, wherein the depositing the first layer is performed prior to the depositing the second layer.

16. The method of claim 14, wherein the depositing the second layer is performed prior to the depositing the first layer.

17. The method of claim 14, wherein the depositing the first layer further comprises depositing a third layer, the third layer comprising silicon and phosphorous.

18. The method of claim 14, wherein the depositing the second layer further comprises depositing a fourth layer, the fourth layer comprising silicon and phosphorous.

* * * * *